US009332661B2

(12) United States Patent
Kudo et al.

(10) Patent No.: US 9,332,661 B2
(45) Date of Patent: May 3, 2016

(54) RECORDING DEVICE

(71) Applicant: SEIKO EPSON CORPORATION, Tokyo (JP)

(72) Inventors: Shoma Kudo, Shiojiri (JP); Shigeto Omatsu, Yamagata-mura (JP); Hideki Kato, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 568 days.

(21) Appl. No.: 13/724,358

(22) Filed: Dec. 21, 2012

(65) Prior Publication Data

US 2013/0161088 A1 Jun. 27, 2013

(30) Foreign Application Priority Data

Dec. 26, 2011 (JP) ................................ 2011-282914

(51) Int. Cl.

| | |
|---|---|
| ***H05K 7/14*** | (2006.01) |
| ***H05K 5/02*** | (2006.01) |
| ***H01R 13/52*** | (2006.01) |
| ***B41J 29/02*** | (2006.01) |
| ***B41J 29/13*** | (2006.01) |
| ***B41J 29/38*** | (2006.01) |

(52) U.S. Cl.

CPC . *H05K 5/02* (2013.01); *B41J 29/02* (2013.01); *B41J 29/13* (2013.01); *B41J 29/38* (2013.01); *H01R 13/5213* (2013.01)

(58) Field of Classification Search

CPC .................................................. H01R 13/5213
USPC ................................................. 174/359, 380
See application file for complete search history.

(56) References Cited

U.S. PATENT DOCUMENTS

| | | | | |
|---|---|---|---|---|
| 5,598,319 | A * | 1/1997 | Lee | 361/679.33 |
| 5,815,379 | A * | 9/1998 | Mundt | 361/679.55 |
| 6,125,031 | A * | 9/2000 | Della Fiora et al. | 361/679.58 |
| 6,525,929 | B2 * | 2/2003 | Carr | 361/679.02 |
| 7,189,084 | B2 * | 3/2007 | Iikura | 439/135 |
| 7,347,712 | B2 * | 3/2008 | O'Connell et al. | 439/373 |
| 8,067,701 | B2 * | 11/2011 | Keiper et al. | 174/356 |
| 2005/0286216 | A1 * | 12/2005 | Chen et al. | G06F 1/181 361/679.4 |
| 2009/0176391 | A1 * | 7/2009 | Brock et al. | 439/136 |

FOREIGN PATENT DOCUMENTS

| | | |
|---|---|---|
| JP | 2008-028548 | 2/2008 |
| JP | 2008-260303 | 10/2008 |
| JP | 2009-148920 | 7/2009 |
| JP | 2011-185985 | 9/2011 |

* cited by examiner

*Primary Examiner* — Hung V Ngo
(74) *Attorney, Agent, or Firm* — Workman Nydegger

(57) ABSTRACT

A printer includes a body case and an interface connector unit that is movable between a hidden position where the interface connector unit is hidden by the body case and an exposed position where the interface connector unit is exposed from the body case.

5 Claims, 6 Drawing Sheets

RECORDING DEVICE

BACKGROUND

1. Technical Field

The present invention relates to a recording device having an interface connector unit.

2. Related Art

In recent years, some recording devices such as printers having an interface connector unit for inserting a removable medium such as a memory card and USB memory have been available. Such recording devices can read image data directly from the removable medium that is inserted through the interface connector unit and print the image without using a computer.

JP-A-2008-260303 discloses a recording device that has an interface connector unit on the front face of the recording device so as to facilitate inserting and removing of a removable medium. Further, JP-A-2011-185985 discloses a recording device that has an openable cover for covering the interface connector unit so that an interface connector unit is not exposed on the front face of the recording device.

However, the interface connector unit such as that disclosed in JP-A-2008-260303 that is disposed to be exposed on the front face of the recording device and the interface connector unit such as that disclosed in JP-A-2011-185985 that is covered with the openable cover have problems in that the shape of the interface connector unit and the shape of the openable cover itself are seen on the appearance of the recording device. This compromises the appearance of the recording device, resulting in decrease in freedom of design of the recording device.

SUMMARY

An advantage of some aspects of the invention is that a recording device having an interface connector unit for inserting a removable medium that is disposed on one side of the recording device without compromising the appearance of the recording device with high design freedom is provided.

According to an aspect of the invention, a recording device includes a case member, and an interface connector unit that is movable between a hidden position where the interface connector unit is hidden by the case member and an exposed position where the interface connector unit is exposed from the case member.

Accordingly, the interface connector unit is exposed from the case member only for inserting the removable medium and is hidden by the case member when the interface connector unit is not used. With this configuration, the freedom of design of the recording device can be increased without compromising the appearance of the recording device when the interface connector unit is not used.

According to the above aspect of the invention, the recording device further includes a holding member that is displaceable between a holding position in which the interface connector unit is held at the hidden position by an external operation and a released position in which the interface connector unit is released from the holding position.

Accordingly, holding and releasing of the interface connector unit at the hidden position can be carried out by a simple configuration of displacing the holding member. Further, holding and releasing of the interface connector unit at the hidden position can be selected by a simple external operation.

According to the above aspect of the invention, the holding member includes an engaging portion in a hook shape that engages a moving member that is movable with the interface connector unit, when the holding member holds the interface connector unit in the hidden position.

Accordingly, holding and releasing of the interface connector unit at the hidden position can be carried out by a simple configuration of engaging and disengaging the engaging portion with the moving member.

Further, in the recording device of the invention, the interface connector unit is displaced from the hidden position to the exposed position by a weight of the interface connector unit itself.

Accordingly, since the interface connector unit is displaced from the hidden position to the exposed position by a weight of the interface connector unit itself, it is not necessary to use a drive source such as a motor during displacement.

According to the above aspect of the invention, the recording device further includes a bias member that assists displacement of the interface connector unit from the hidden position to the exposed position.

Accordingly, since the displacement of the interface connector unit from the hidden position to the exposed position can be carried out by using a biasing force of the bias member, it is possible to displace the interface connector unit faster when the direction of displacement is the gravity direction. Further, the direction of displacement is not limited to the gravity direction, and the interface connector unit can be displaced in any direction to be exposed.

According to the above aspect of the invention, a front face of the case member is composed of a lower frame and an upper frame which is located upper position with respect to the lower frame and extends forward from the lower frame, and the interface connector unit is disposed between the upper frame and the lower frame so as to move between the exposed position and the hidden position.

Accordingly, the front face of the case member is composed of a lower frame in which an output tray is disposed and an upper frame which is located upper position with respect to the lower frame and extends forward from the lower frame, and the interface connector unit is disposed between the lower frame and the upper frame so as to be movable between the hidden position where the interface connector unit is hidden by the upper frame, which forms a part of the case member, as viewed from the front side of the upper frame and an exposed position where the interface connector unit is exposed downward from the upper frame.

According to the above aspect of the invention, the recording device further includes a rotatable arm having one end on which the interface connector unit is mounted and the other end supported by a support shaft that extends in a main scan direction, and a stopper provided on the upper end of the lower frame, wherein the stopper abuts against the arm so as to regulate rotation of the arm.

Accordingly, an arm member which is provided with the interface connector unit on the distal end surface is disposed in the case member at a position adjacent to a border between the lower frame and the upper frame in the up-down direction. Further, the proximal end of the arm member is located in the case member at a position behind the lower frame and is rotatably supported by the support shaft that extends in the main scan direction. The rotation of the arm makes it possible to move the interface connector unit. Moreover, the stopper which is the upper end of the lower frame abuts against the arm when the arm rotates by a predetermined angle, thereby preventing the arm from further rotating.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
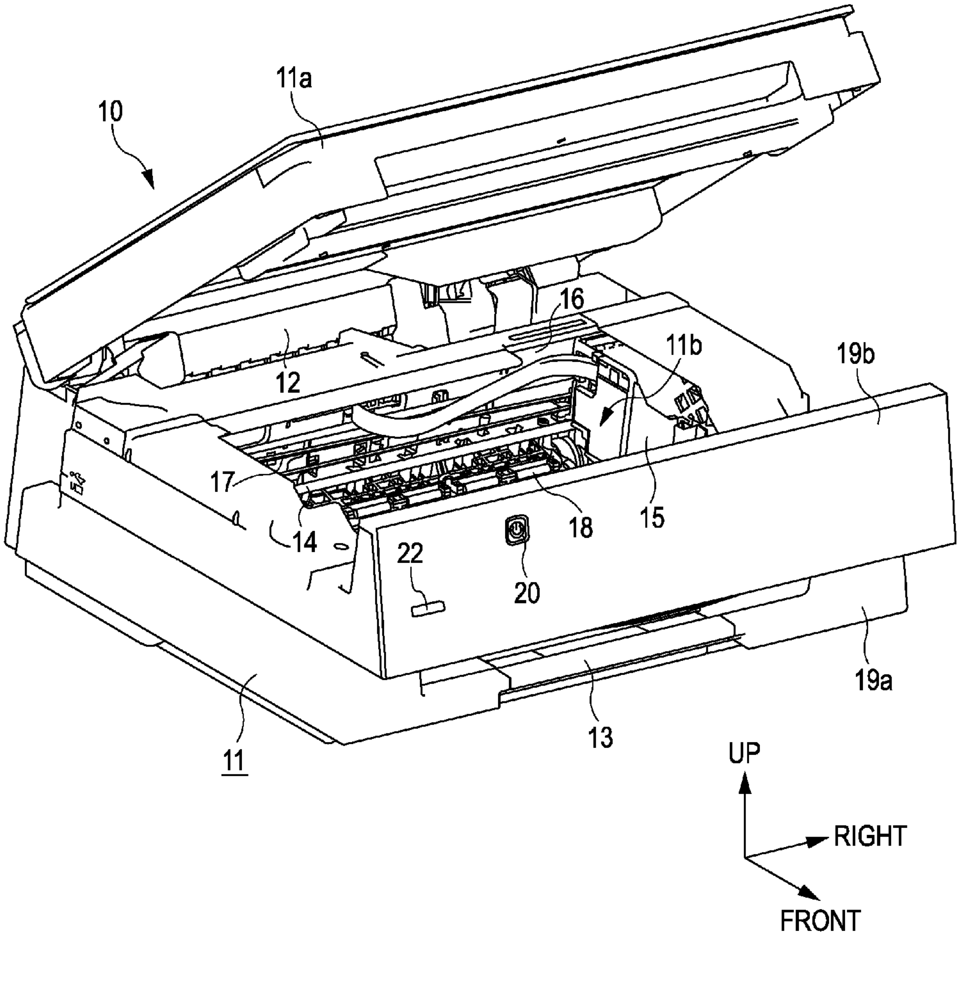
FIG. 1 is a perspective view of a printer according to the invention.

An embodiment of the invention will be described below with reference to FIGS. 1 to 6. In this embodiment, the invention is implemented as an ink jet printer (hereinafter, also referred to as "printer 10") which is a type of recording device. As shown in FIG. 1, the printer 10 of this embodiment has a body case 11 formed substantially in a rectangular box shape as an example of a case member. A sheet feeding tray 12 is provided on a back face of the body case 11 so that a plurality of paper sheets can be placed therein. The printer 10 performs printing on the paper sheets which are fed out one by one from the sheet feeding tray 12, and outputs the paper sheets on which printing has been performed on a slide-type output tray 13 that is disposed at the lowest position on a front face of the body case 11. Further, a scanner case 11*a* is supported on the body case 11 so as to be movable between an opened position (which is shown in FIG. 1) where the scanner case 11*a* uncovers an upper opening 11*b* of the body case 11 and a closed position where the scanner case 11*a* covers the upper opening 11*b*.

Next, an internal configuration of the printer 10 will be described below. As shown in FIG. 1, a guide rail 14 having a predetermined length extends between inner surfaces of right and left side walls of the body case 11 of the printer 10 such that a carriage 15 can reciprocate along the guide rail 14 in a main scan direction (the right-left direction). The carriage 15 is secured to an endless timing belt 17 that is wound around a pair of pulleys (not shown in the figure) mounted on a back frame 16. Accordingly, as the pulleys are driven to rotate in the forward or backward direction by a drive unit, the timing belt 17 turns in the forward or backward direction, which causes the carriage 15 to reciprocate in the main scan direction.

An ink jet print head (not shown in the figure) as an example of liquid ejecting head is disposed in the lower portion of the carriage 15, and a plurality of ink cartridges (not shown in the figure) are loaded in the upper portion of the carriage 15. The print head is configured to eject ink supplied from the ink cartridges through nozzles that are formed for each of colors on the underside of the recording head.

A support table (not shown in the figure) that defines a distance (gap) between the print head and the paper sheet is disposed below the print head at a position opposite the print head. The support table extends in the right-left direction over a range that includes a printing area in which printing is performed by the print head. During printing, ink droplets ejected from the print head land on the portion of the paper sheet which is located on the support table.

Further, a pair of transportation rollers 18 that transport the paper sheet are disposed on the support table at positions upstream and downstream in the transportation direction. As the pair of transportation rollers 18 are driven to rotate by the drive unit, the paper sheet is transported toward the output tray 13 while being pinched between the pair of transportation rollers 18.

As described above, texts or images can be printed on the paper sheet by alternatively repeating a printing operation in which ink is ejected from the nozzles of the print head onto the paper sheet while the carriage 15 reciprocates in the main scan direction (the right-left direction) and a feeding operation in which the paper sheet is transported in a sub-scan direction (the front direction) by a predetermined transportation distance.

Figure 2:
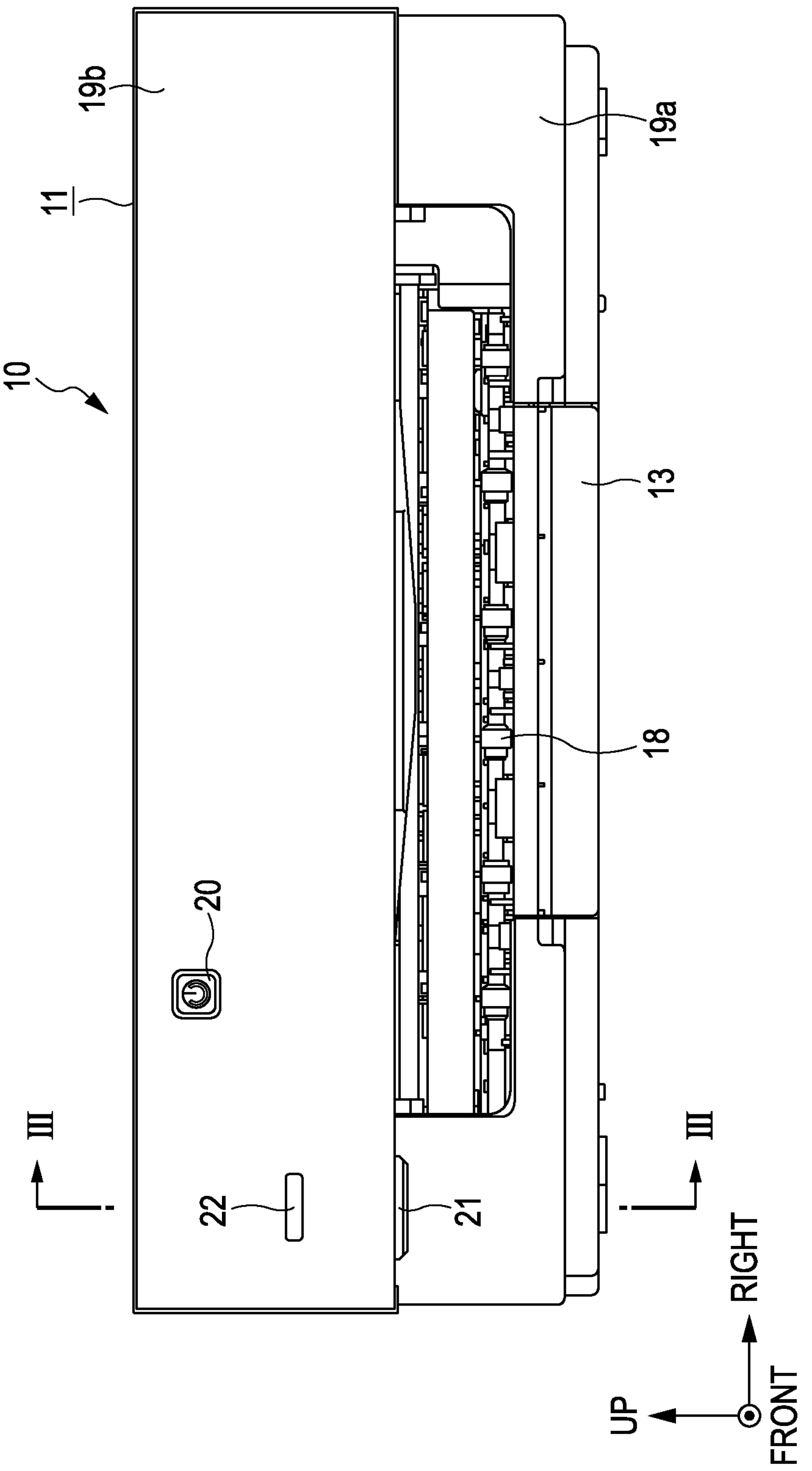
FIG. 2 is a front view of the printer in which an interface connector unit is in a hidden position.
Figure 5:
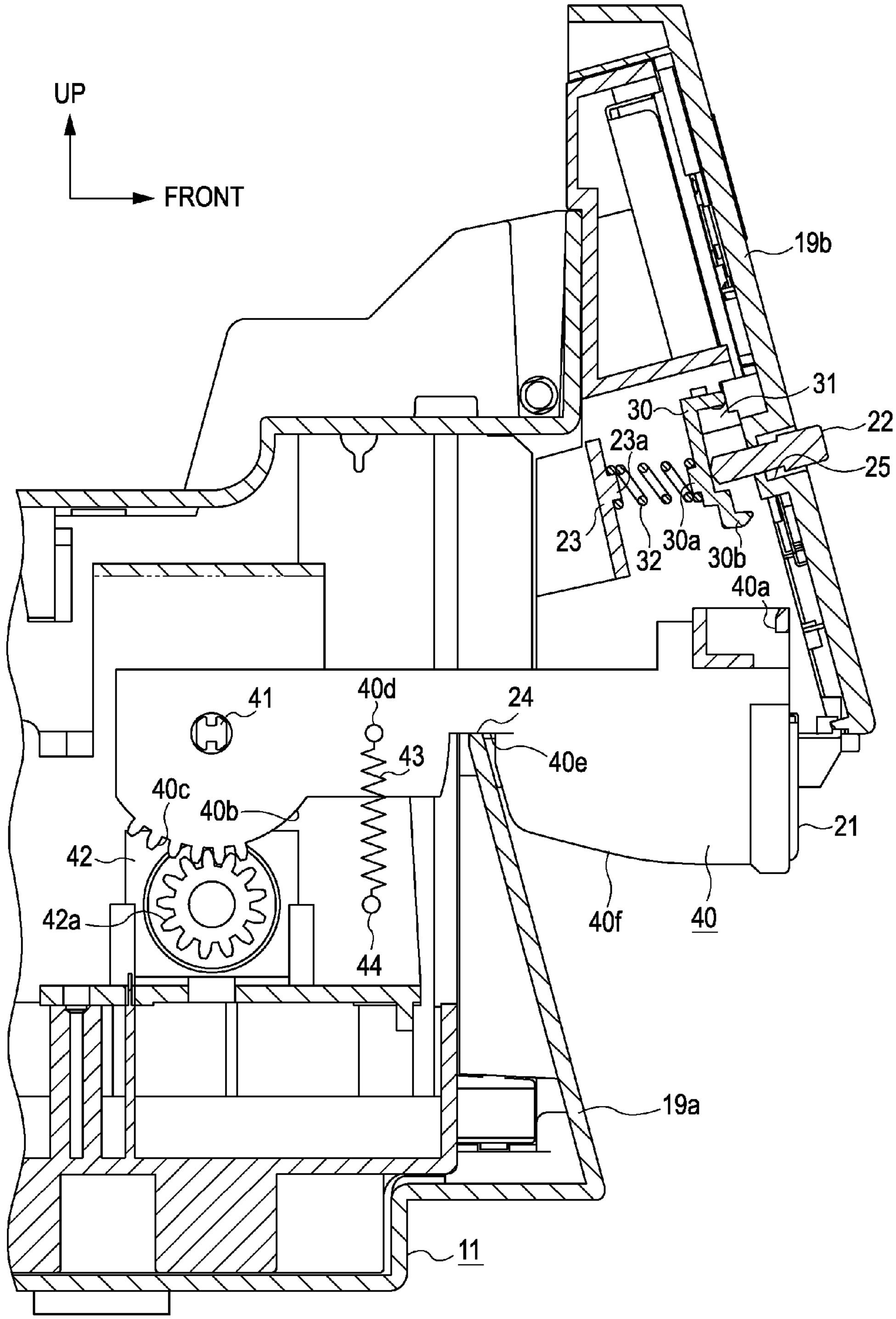
FIG. 5 is a cross sectional view of FIG. 4 in which the interface connector unit has been moved to an exposed position.
Figure 6:
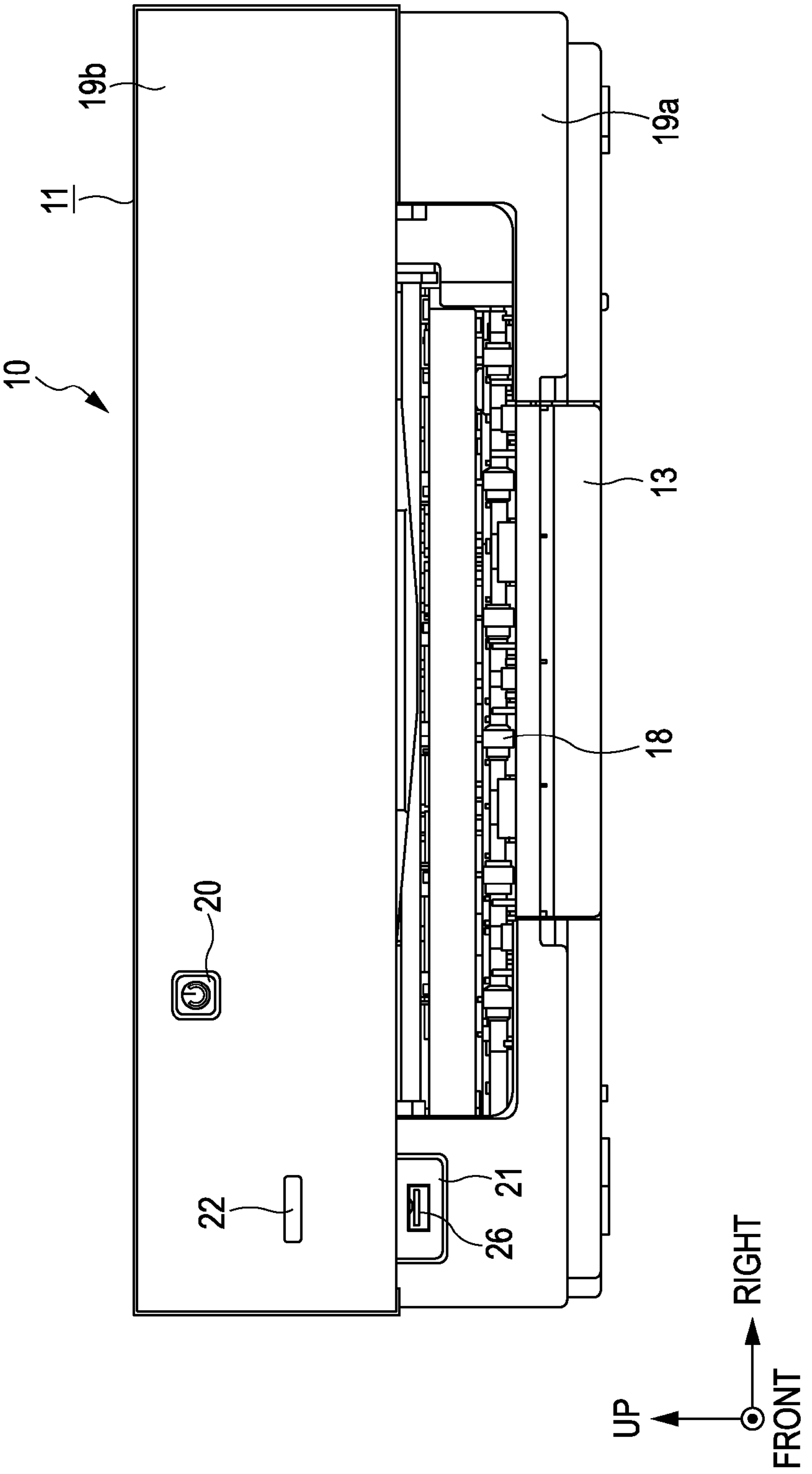
FIG. 6 is a front view of the printer in which the interface connector unit has been moved to the exposed position.

As shown in FIGS. 1 and 2, the front face of the body case 11 of the printer 10 is composed of a lower frame 19*a* in which the output tray 13 is disposed and an upper frame 19*b* that is disposed at an upper position with respect to the lower frame 19*a* and extends forward from the lower frame 19*a*. As viewed from the front side of the upper frame 19*b*, a power button 20 of the printer 10 and a release button 22 are disposed in the left area on the surface of the upper frame 19*b*. The release button 22 is pressed to move an interface connector unit 21 from the inside to the outer side of the upper frame 19*b* so as to expose the interface connector unit 21. Further, the interface connector unit 21 which has an USB port 26 (see FIG. 6) is disposed at a position below the release button 22 and is movable between a hidden position (which is shown in FIGS. 2 and 3) where the interface connector unit 21 is hidden by the upper frame 19*b*, which forms a part of the body case, as viewed from the front side (one side) of the upper frame 19*b* and an exposed position (which is shown in FIGS. 5 and 6) where the interface connector unit 21 is exposed downward from the upper frame 19*b*.

Figure 3:
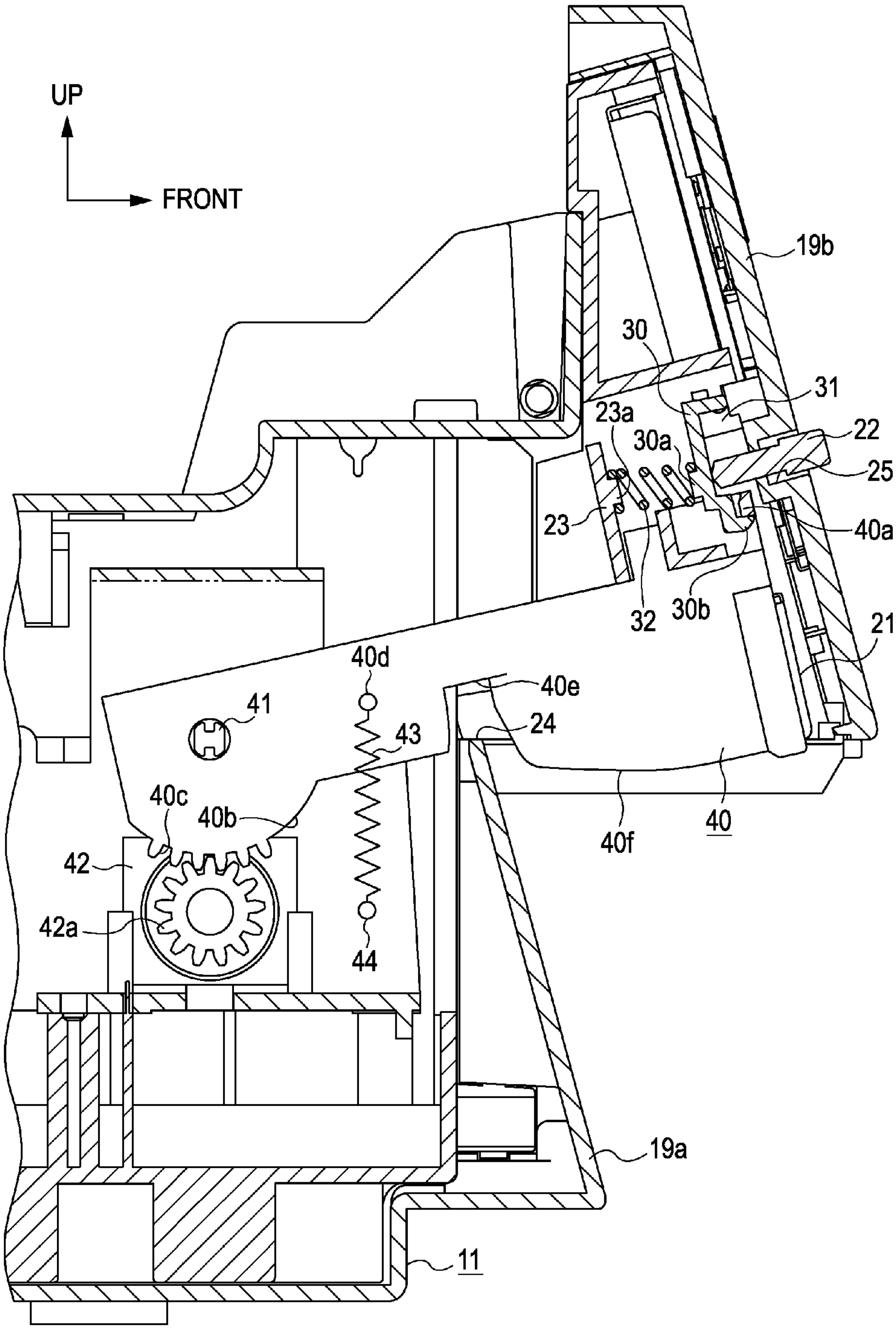
FIG. 3 is a cross sectional view of the printer taken along the arrow of FIG. 2.

As shown in FIG. 3, the distal end of the release button 22 is inserted into the inside of the printer 10 through a through hole 25 that is formed to penetrate the upper frame 19*b*. Further, an engaging hook 30 formed of a plate piece as an example of holding member is disposed inside the upper frame 19*b* at a position on the axis of the through hole 25. The distal end of the release button 22 abuts against the front face of the engaging hook 30 that faces the through hole 25. Further, an upper end shaft (not shown in the figure) of the engaging hook 30 is rotatably supported by a bearing 31 that is disposed inside the upper frame 19*b* at an upper position with respect to the through hole 25 such that the front face thereof downwardly extends along the inner surface of the upper frame 19*b*.

Moreover, a support plate 23 is disposed inside the printer 10 at a position facing the back face of the engaging hook 30 so that the front face of the support plate 23 opposes the back face of the engaging hook 30. Spring washers 23*a* and 30*a* are disposed on the front face of the support plate 23 and the back face of the engaging hook 30, respectively. A coil spring 32 as an example of bias member is secured between the spring washers 23*a* and 30*a* in a compressed state. Accordingly, the compressed coil spring 32 applies a biasing force on the engaging hook 30 in a direction in which the release button 22 that abuts against the engaging hook 30 is pushed to the outside of the printer 10 (the front direction in the figure).

As also shown in FIG. 3, an arm member 40 as an example of moving member is disposed in the body case 11 at a border between the lower frame 19*a* and the upper frame 19*b* in the up-down direction. The arm member 40 is provided with the interface connector unit 21 on the distal end surface thereof. The distal end of the arm member 40 is located adjacent to the inner surface of the upper frame 19*b*, while the proximal end of the arm member 40 is located in the body case 11 at a position behind the lower frame 19*a*. Further, the proximal end of the arm member 40 is rotatably supported by a support shaft 41 that extends in the main scan direction (a direction perpendicular to the sheet of FIG. 3) in the body case 11.

The arm member 40 has an engaged portion 40*a* that is formed on the upper edge of the distal end thereof which is capable of engaging an engaging portion 30*b* that is formed at the distal end (the lower end in FIG. 3) of the engaging hook 30. When the engaged portion 40*a* engages the engaging portion 30*b* of the engaging hook 30, the arm member 40 is held at the position shown in FIG. 3.

A circular arc surface 40*b* having its center at the support shaft 41 is formed at the proximal end of the arm member 40 at a position lower than the rotation center of the arm member 40 with teeth 40*c* being formed on the circular arc surface 40*b*. The teeth 40*c* mesh with a driven gear 42*a* that is disposed below the circular arc surface 40*b*. The driven gear 42*a* is connected with a rotation shaft of a rotary damper 42 that uses a braking power caused by viscosity resistance of oil.

Further, a spring support 40*d* that supports one end of a tension coil spring 43 is disposed at a position forward of the rotation center of the arm member 40 (the right side of FIG. 3) and spaced by a predetermined distance, while a spring support 44 that supports the other end of the tension coil spring 43 is disposed in the body case 11 at a position below the spring support 40*d*. The tension coil spring (bias member) 43 is supported in a tensioned state between the spring supports 40*d* and 44 such that a downward biasing force is constantly applied on the spring support 40*d* of the arm member 40 by the tension coil spring 43.

Further, a rotation restricting member 40*e* is disposed at a position forward of the spring support 40*d* of the arm member 40 (the right side of FIG. 3) and spaced by a predetermined distance so that the rotation restricting member 40*e* prevents the arm member 40 from rotating over a predetermined angle when the arm member 40 rotates in a direction of the biasing force from the tension coil spring 43 (clockwise direction in FIG. 3). When the arm member 40 rotates by a predetermined angle, the rotation restricting member 40*e* abuts against a stopper 24 which is an upper end of the lower frame 19*a*, thereby preventing the arm member 40 from further rotating. Further, a portion of the bottom of the arm member 40 from the rotation restricting member 40*e* to the distal end of the arm member 40 which is located forward (on the right side of FIG. 3) of the rotation restricting member 40*e* is a push-up surface 40*f* that is used for a push-up operation during rotation of the arm member 40 in a direction that resists the biasing force of the tension coil spring 43 (counterclockwise direction in FIG. 3).

Next, an operation of the printer 10 having the above configuration will be described, focusing on the action of the interface connector unit 21. When the interface connector unit 21 is not required to be used, the interface connector unit 21 is usually in the hidden position where the interface connector unit 21 is hidden behind the upper frame 19*b* of the body case 11 as shown in FIGS. 2 and 3. The engaging hook 30 is in a holding position for holding the interface connector unit 21 in the hidden position by engaging the engaging portion 30*b* of the distal end of the engaging hook 30 with the engaged portion 40*a* of the arm member 40. When the interface connector unit 21 is required to be used, a user presses the release button 22 to expose the interface connector unit 21 on the side of the front face of the printer 10 as described below.

That is, in the state of the hidden position where the interface connector unit 21 is hidden behind the upper frame 19*b* as shown in FIG. 3, the user presses the release button 22 by external operation so as to push the release button 22 into the printer 10. As a result, the distal end of the release button 22 presses the engaging hook 30, which causes the engaging hook 30 to rotate about the shaft that is supported by the bearing 31 in a direction in which the coil spring is compressed. Accordingly, the engaging hook 30 that has been in the engaged state (the state of the holding position) where the engaging portion 30*b* of the distal end of the engaging hook 30 engages the engaged portion 40*a* of the arm member 40 is displaced to a released position where the engaging portion 30*b* is disengaged.

As a consequence, the arm member 40 is not held in the state of FIG. 3, that is, the state in which the interface connector unit 21 is in the hidden position, and starts to rotate downward (in the clockwise direction in FIG. 4) due to the weight of the arm member 40 and the tension force of the tension coil spring 43. Since the teeth 40*c* formed on the circular arc surface 40*b* on the proximal end of the arm member 40 mesh with the driven gear 42*a*, the rotary damper 42 is driven when the arm member 40 rotates. Then, the arm member 40 is subject to the viscous force in a direction opposite to the rotation direction by the operation of the rotary damper 42, thereby decreasing a rotation speed of the arm member 40.

When the arm member 40 rotates at this speed by a predetermined angle, the rotation restricting member 40*e* of the arm member 40 abuts against the stopper 24 of the lower frame 19*a* of the body case 11 to stop its rotation as shown in FIG. 5. As a result, the interface connector unit 21 comes into the exposed position where the entire interface connector unit 21 is exposed downward from the upper frame 19*b* as shown in FIGS. 5 and 6.

Figure 4:
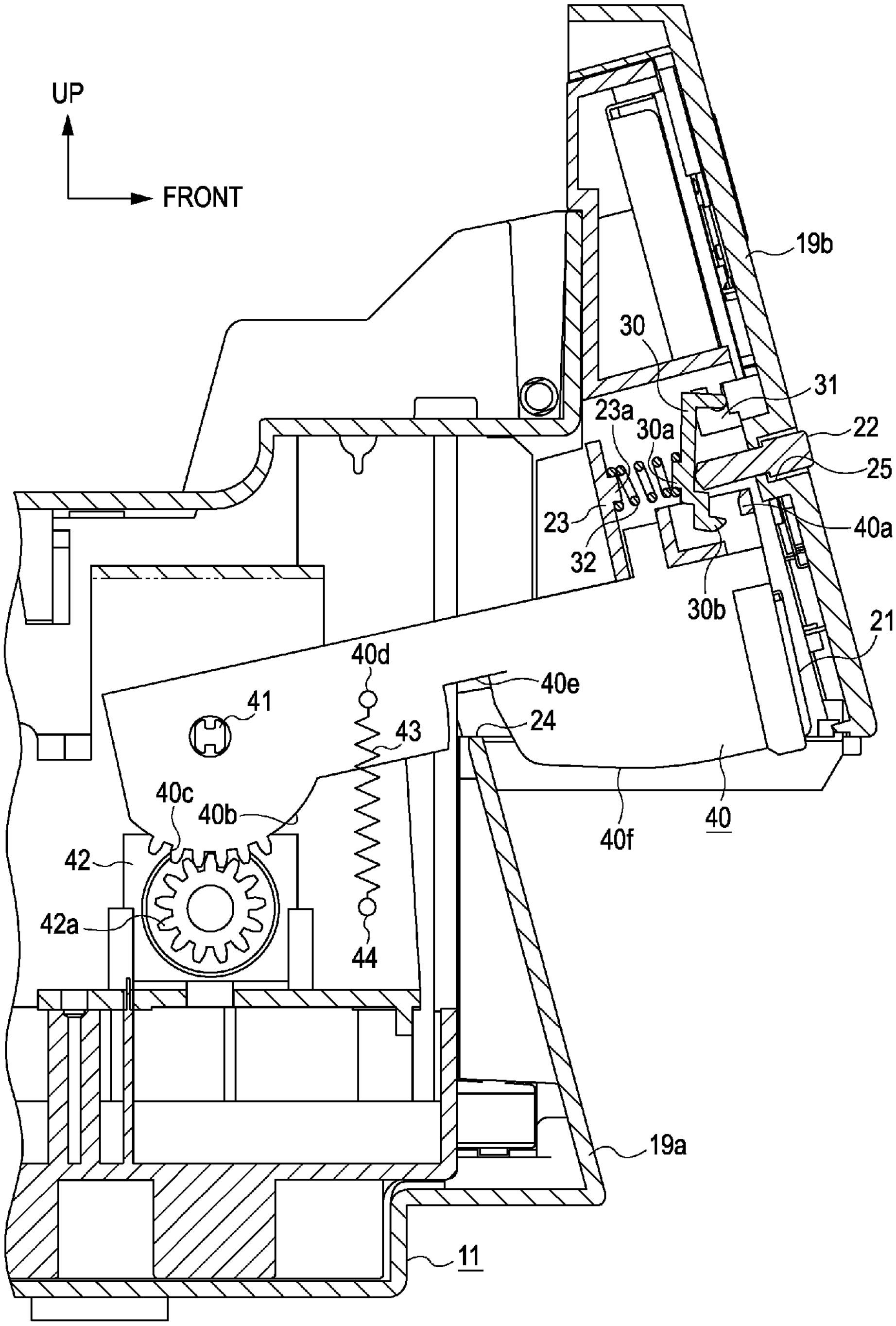
FIG. 4 is a cross sectional view of FIG. 3 in which a release button has been pressed.

The release button 22 which has been pressed down as shown in FIG. 4 recovers to the original state (which is the state of FIG. 3) due to a restoring force of the coil spring 32, when a pressing force by external operation is released as shown in FIG. 5. Similarly, the engaging hook 30 shown in FIG. 4 also recovers to the original state (which is the state of FIG. 3) due to a restoring force of the coil spring 32 itself, when a pressing force from the release button 22 is released as shown in FIG. 5.

As described above, the interface connector unit 21 is exposed on the side of the front face of the printer 10 so that the USB port 26 on the interface connector unit 21 becomes available for use. Then, when use of the interface connector unit 21 is completed, the arm member 40 is operated to move in the up direction (counter clockwise direction in FIG. 5) so as to place the interface connector unit 21 back into the hidden position where the interface connector unit 21 is hidden behind the upper frame 19*b* as shown in FIG. 3.

That is, when the push-up surface 40*f* of the arm member 40 is pushed up in the up direction by an external operation, the engaged portion 40*a* comes into contact with the engaging portion 30*b* of the distal end of the engaging hook 30. Then, the engaged portion 40*a* that is further moving upward is in sliding contact with the distal end of the engaging hook 30 which rotates about the shaft that is supported by the bearing 31. The sliding contact between the distal end of the engaging hook 30 and the engaged portion 40*a* displaces the engaging hook 30 in a direction in which the coil spring 32 is compressed.

When the push-up surface 40*f* of the arm member 40 is further pushed up in the up direction, the sliding contact between the engaging hook 30 and the engaged portion 40*a* ends such that the engaging hook 30 returns to the state of the holding position shown in FIG. 3 due to the restoring force of the compressed coil spring 32 and the engaging hook 30 itself. As a result, the arm member 40 is held in the holding state in which the engaged portion 40*a* engages the engaging portion 30*b* of the engaging hook 30.

According to the above-mentioned embodiment, the following effect can be obtained:

(1) The interface connector unit 21 having the USB port 26 for inserting a USB memory as an example of removable medium can be exposed downward from the upper frame 19*b* of the body case 11 only for inserting the USB memory, and be hidden by the upper frame 19*b* when the interface connector unit 21 is not used. Accordingly, the freedom of design of the printer 10 can be increased without compromising the appearance of the printer 10 by hiding the interface connector unit 21 behind the upper frame 19*b* when the interface connector unit 21 is not used.

(2) Holding and releasing of the interface connector unit 21 at the hidden position can be carried out by simple operation which is displacement with rotation of the engaging hook 30. Further, holding and releasing of the interface connector unit 21 at the hidden position can be selected by a user through a simple external operation.

(3) Holding and releasing of the interface connector unit 21 at the hidden position behind the upper frame 19*b* can be carried out by a simple configuration of engaging and disengaging the engaging portion 30*b* of the engaging hook 30 with engaged portion 40*a* of the arm member 40 which serves as a moving member.

(4) Since the interface connector unit 21 is displaced from the hidden position to the exposed position by a weight of the interface connector unit 21 itself, it is not necessary to separately provide a drive source for displacement of the interface connector unit 21.

(5) Since the displacement of the interface connector unit 21 from the hidden position to the exposed position can be carried out by using a biasing force of the tension coil spring 43, it is possible to displace the interface connector unit 21 faster when the direction of displacement is the gravity direction. Further, the direction of displacement is not limited to the gravity direction, and the interface connector unit 21 can be displaced in any direction to be exposed. Accordingly, it is possible to dispose the interface connector unit 21 so as to be movable between the hidden position and the exposed position which is on the top or side face of the printer 10, thereby further increasing the freedom of design.

(6) Since the rotary damper 42 applies resistance to the arm member 40 in a direction opposite to the rotation direction during rotation of the arm member 40, it is possible to slowly rotate the arm member 40. This prevents the interface connector unit 21 from being damaged due to a sudden movement of the arm member 40.

The following modifications can be made to the above-mentioned embodiment:

The holding member may include a component other than the engaging hook 30, such as a push-latching button.

A configuration in which the interface connector unit 21 moves between the exposed position and the hidden position by rotation of the arm member may be modified to a configuration in which the interface connector unit 21 moves between the exposed position and the hidden position by linear motion of a linear motion member that holds the interface connector unit 21.

The interface connector unit 21 may be provided with a card slot for SD card or memory stick instead of the USB port 26, and may also be provided with a port of various standards such as IEEE1394 and a connector for power supply cable. The number of slots or connectors may be two, three, or more.

The release button 22 and the engaging hook 30 may be integrally formed.

The release button 22 and the interface connector unit 21 may not be necessarily provided on the front face of the printer 10.

The interface connector unit 21 may not be necessarily exposed downward (in the gravity direction), and may be exposed upward or in the left or right direction by using a biasing force of a spring and the like.

The rotary damper 42 may be replaced with a cylinder damper. In this case, the teeth 40*c* and the driven gear 42*a* are not necessary, and the rotary damper 42 may be eliminated.

The tension coil spring 43 for biasing the arm member 40 downward (in the gravity direction) may be eliminated.

Although the recording device is embodied as an ink jet recording device in the above embodiment, the recording device is not limited thereto and may also be embodied as a liquid ejection apparatus that ejects a liquid other than ink or a liquid material (including a fluid material such as a gel) containing particles of functional material dispersed or mixed in a liquid. For example, a liquid ejection apparatus that ejects a liquid material containing materials such as electrode material and color material (pixel material) in a dispersed or dissolved state, which are used for manufacturing of liquid crystal displays, EL (electroluminescence) displays, surface emitting displays and the like may be used. Further, a liquid ejection apparatus that ejects bioorganic materials used for manufacturing biochips and a liquid ejection apparatus that is used as a precision pipette and ejects the liquid of a sample may also be used. In addition, a liquid ejection apparatus that ejects transparent resin liquid such as a thermoset resin onto a substrate for manufacturing of minute hemispheric lenses (optical lenses) used for optical communication elements or the like, a liquid ejection apparatus that ejects acid or alkali etching liquid for etching a substrate or the like, and a fluid ejection apparatus that ejects a fluid such as a gel (for example, a physical gel) may also be used. The invention may be applied to any one of the above-mentioned liquid ejection apparatuses. The recording medium is not limited to a sheet of paper (cut sheet paper or continuous sheet paper), and may include a substrate on which elements and wirings are formed by ink jet. Further, a sheet made of a synthetic resin or metal may be used. The "liquid" as used herein includes a liquid (such as inorganic solvent, organic solvent, liquid solution, liquid resin and liquid metal (molten metal)), a liquid material and a fluid material. That is, a liquid that needs to be dried by a drying air from a drying unit may be used.

Further, although the invention has been described by using the ink jet printer in the above embodiment, the invention is not limited thereto and may be applied to other type of recording devices, including printers having a line-type ink jet head, laser printers, thermal transfer printers, and dot matrix printers.

The entire disclosure of Japanese Patent Application No. 2011-282914, filed Dec. 26, 2011 is expressly incorporated by reference herein.

What is claimed is:

1. A recording device comprising:

a body case member comprising an upper frame and a lower frame;

an interface connector unit that is movable between a hidden position where the interface connector unit is hidden by the body case member and an exposed position where the interface connector unit is exposed from the body case member;

a holding member that is displaceable between a holding position in which the interface connector unit is held at the hidden position by an external operation and a released position in which the interface connector unit is released from the holding position; and a resistance applying member which applies a resistance to displacement of the holding member;

a rotatable arm having one end on which the interface connector unit is mounted and the other end supported by a support shaft that extends in a main scan direction of a print head of the recording device; and a stopper provided on the upper end of the lower frame, wherein the stopper abuts against the arm so as to regulate rotation of the arm, wherein the resistance applying member includes a rotary damper which applies the resistance to the rotatable arm in a direction opposite to a rotation direction during rotation of the rotatable arm.

2. The recording device according to claim 1 wherein the holding member includes an engaging portion in a hook shape that engages a moving member that is movable with the interface connector unit, when the holding member holds the interface connector unit in the hidden position.

3. The recording device according to claim 1 wherein the interface connector unit is displaced from the hidden position to the exposed position by a weight of the interface connector unit itself.

4. The recording device according to claim 1, further comprising a bias member that assists against the resistance to displacement of the holding member from the hidden position to the exposed position.

5. The recording device according to claim 1 wherein a front face of the body case member is composed of a lower frame and an upper frame which is located upper position with respect to the lower frame and extends forward from the lower frame, and the interface connector unit is disposed between the upper frame and the lower frame so as to move between the exposed position and the hidden position.

* * * * *